(12) United States Patent
Mase et al.

(10) Patent No.: US 6,200,868 B1
(45) Date of Patent: Mar. 13, 2001

(54) INSULATED GATE TYPE SEMICONDUCTOR DEVICE AND PROCESS FOR PRODUCING THE DEVICE

(75) Inventors: Akira Mase, Okazaki; Tomoyoshi Kushida, Seto, both of (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 09/126,722

(22) Filed: Jul. 31, 1998

(30) Foreign Application Priority Data

Jul. 31, 1997 (JP) ................................................ 9-205915

(51) Int. Cl.⁷ ................................................ H01L 21/336
(52) U.S. Cl. ......................... 438/301; 438/305; 438/265
(58) Field of Search ..................... 438/265, 303, 438/305

(56) References Cited

U.S. PATENT DOCUMENTS

| 4,774,198 | * | 9/1988 | Conciero et al. . | |
| 4,931,408 | * | 6/1990 | Hsieh . | |
| 5,118,638 | * | 6/1992 | Fujihira . | |
| 5,145,797 | * | 9/1992 | Nakanishi . | |
| 5,208,175 | * | 5/1993 | Choi et al. . | |
| 5,338,693 | | 8/1994 | Kinzer et al. ........................... | 437/29 |
| 5,358,879 | | 10/1994 | Brady et al. ............................ | 437/44 |
| 5,407,844 | | 4/1995 | Smayling et al. ....................... | 437/34 |
| 5,451,806 | | 9/1995 | Davies .................................... | 257/370 |
| 5,521,409 | | 5/1996 | Hsieh et al. ............................ | 257/341 |
| 5,637,514 | * | 6/1997 | Jeng et al. . | |
| 5,943,592 | * | 8/1999 | Tsukamoto et al. . | |
| 5,976,934 | * | 11/1999 | Hayakawa . | |
| 5,998,274 | * | 12/1999 | Akram et al. . | |

FOREIGN PATENT DOCUMENTS

| 0 658 940 A1 | 11/1993 | (EP) . |
| 0 693 773 A1 | 7/1994 | (EP) . |
| 0 749 158 A1 | 6/1995 | (EP) . |
| 0 755 077 A2 | 7/1996 | (EP) . |
| 7-335874 | 12/1995 | (JP) . |
| 10-154802 | * 6/1996 | (JP) . |

OTHER PUBLICATIONS

Chow, et al., "A Self–Aligned Short Process for Insulated–Gate Bipolar Transistors" *IEEE Transactions on Electron Devices*, vol. 39, No. 6 (Jun. 1992) pp. 1317–1320.

* cited by examiner

Primary Examiner—Richard Booth
Assistant Examiner—Jonathan Hach
(74) Attorney, Agent, or Firm—Pillsbury Madison & Sutro LLP

(57) ABSTRACT

A side insulation layer is formed on a side wall of a gate electrode by oxidizing (or nitrizing) a substance of the gate electrode, so that the gate electrode is insulated from the semiconductor substrate with the side insulation layer and a gate insulation film. The gap between the gate electrode and the semiconductor substrate is greater around the side wall of the gate electrode than around the center thereof. The gap between the side wall of the gate electrode and the semiconductor substrate is densely filled with an insulating substance.

4 Claims, 8 Drawing Sheets

INSULATED GATE TYPE SEMICONDUCTOR DEVICE AND PROCESS FOR PRODUCING THE DEVICE

INCORPORATION BY REFERENCE

The disclosure of Japanese Patent Application No. HEI 9-205915 filed on Jul. 31, 1997 including specification, drawings and abstract is incorporated herein by reference in its entirety.

BACKGROUND OF THE INVENTION

1. Field of the Invention

The present invention relates to an insulated gate type semiconductor device that controls current by applying voltage to a gate electrode insulated from a semiconductor substrate and to a process for producing such a device. More specifically, the present invention relates to an insulated gate type semiconductor device capable of controlling large current with a high voltage resistance between an end portion of the gate electrode and the semiconductor substrate. The present invention also relates to a process for producing such a device, the manufacturing process providing a high yield and being simpler than know manufacturing processes.

2. Description of the Related Art

A semiconductor device (a power IC or the like) that is used in a power system for controlling large current by applying voltage to a digital circuit is primarily constituted by an IGBT (Insulated Gate Bipolar Transistor). This kind of semiconductor device generally has a structure as shown in FIG. 10. That is, a gate electrode 84 is formed on a semiconductor substrate 80, which is in contact with a source electrode 86. The semiconductor substrate 80 is provided with a known well structure such as a source diffusion portion 88 or the like. The pn-junction of the well structure prevents current from flowing in a direction of thickness of the gate electrode 84 if no voltage is applied thereto. The gate electrode 84 is insulated from the semiconductor substrate 80 with a gate insulation film 85. The gate electrode 84 is also insulated from the source electrode 86 with an interlayer insulation film 87. The semiconductor device of such a structure is called an insulated gate type semiconductor device. This kind of semiconductor device generally employs a layout wherein two elements are symmetrically arranged on left and right sides as shown in FIG. 10.

If a predetermined gate voltage is applied to the gate electrode 84 while a certain voltage is applied to the semiconductor substrate 80 in a direction of thickness thereof, a channel is formed in the semiconductor substrate 80, whereby current flows in a direction of thickness thereof. If the application of gate voltage is suspended, the current also stops flowing. In this manner, it is possible to control current by adjusting gate voltage. This operation substantially requires a voltage resistance of more than 30V between the gate electrode 84 and the semiconductor substrate 80.

A process for producing this kind of semiconductor device generally includes the steps of (a) sequentially forming the gate insulation film 85 and polycrystalline silicon on the entire surface of the semiconductor substrate 80, (b) subjecting the polycrystalline silicon to a patterning processing to form the gate electrode 84, (c) removing a portion of the gate insulation film 85 that is not covered with the gate electrode 84, (d) forming a well structure such as the source diffusion portion 88 and the like by means of ion implantation and an annealing process and (e) subsequently forming the interlayer insulation film 87 and the source electrode 86. In this manner, the semiconductor device as shown in FIG. 10 is obtained.

However, this semiconductor device has drawbacks, which will hereinafter be described. First, the semiconductor device cannot ensure a sufficient voltage resistance between the gate electrode 84 and the semiconductor substrate 80. This is because the gate insulation film 85 has a defect at an end portion of the gate electrode 84. That is, in removing the gate insulation film 85 (usually by means of wet chemical etching) in the aforementioned step (c), damage is caused to the portion of the gate insulation film 85 that is located under the end of the gate electrode 84, so that an undercut 90 as shown in an enlarged view of FIG. 11 is generated. Thereafter, the well structure is formed in the aforementioned step (d) and the interlayer insulation film 87 is formed (usually by Chemical Vapor Deposition method: CVD) in the aforementioned step (e). However, the undercut 90 remains as a void instead of being completely filled. This is partly because a sufficient amount of oxide layer cannot be formed in the undercut 90 due to an insufficient supply of oxygen in an intermediate step of thermal oxidation and partly because upon formation of the interlayer insulation film 87 by CVD, an entrance thereof is closed.

Hence, the oxide layer, effective in insulating the gate electrode 84 from the semiconductor substrate 80, does not have an enough thickness at the end portion of the gate electrode 84, thereby resulting in a low voltage resistance. Further, conductive dust may enter the void and remain therein during one of the intermediate steps, which also causes a decrease in voltage resistance. Conductive dust includes a photo-resist, a byproduct produced during etching of silicon, water content used during a washing process and the like. When a gate voltage is applied, a comparatively strong electric field is generated in the vicinity of the end of the gate electrode 84. Thus, apart from a device with a low operating voltage such as a memory or a logical circuit, if the semiconductor device is used in a power system, dielectric breakdown may occur between the end portion of the gate electrode 84 and the semiconductor substrate 80.

To deal with the problem of decrease in voltage resistance, it has been considered to leave a certain width 91 of gate insulation film 85 protruding from the end portion of the gate electrode 84 (See FIG. 12). However, this requires using a photomask to leave the gate insulation film 85 of the width 91 and additional steps to remove the photomask after etching, which causes a problem of an increase in costs and the time required to produce the semiconductor device.

Further, if the aforementioned step (d) of ion implantation is carried out using an ion of a relatively large atomic diameter such as arsenic, the ion does not sufficiently permeate into an oxide film. Thus, the portion of the semiconductor substrate 80 having the width 91 cannot be implanted with a sufficient amount of the ion. To form such a well structure as to provide the elements with suitable characteristics, it is necessary to control the width 91 (about 0.5 $\mu$m) and the related alignment with absolute precision. However, conventional photolithography apparatus provides an insufficient alignment precision of about 0.2 $\mu$m. Therefore, there is a difference in the width 91 generated between the left and right elements in FIG. 10 and the characteristics of the elements cannot be maintained uniform, thereby causing a decrease in yield.

Another approach to the problem of decrease in voltage resistance is disclosed in Japanese Patent Application Laid- Open No. HEI 7-335874. A side wall (spacer) is formed beside a gate electrode by CVD and ion implantation is carried out to form a well structure using the side wall as a mask. However, in this case, the thickness of the side wall deposited by CVD differs among or inside wafers. Hence, it is difficult to keep the characteristics of the elements uniformity, which decreases yield. The deposition layer formed by CVD or the like is not necessarily high in dielectric strength because the layer has a void at an interface between the deposition layer and the gate electrode or because the deposited substance itself contains dust or small-size lumps.

SUMMARY OF THE INVENTION

In order to overcome the aforementioned problems, a first aspect of the present invention provides an insulated gate type semiconductor device including a gate electrode formed on a semiconductor substrate, agate insulation film located between the gate electrode and the semiconductor substrate and a side insulation layer formed by turning a substance of the gate electrode into an insulating substance, wherein the gate electrode is insulated from the semiconductor substrate with the gate insulation film and the side insulation layer.

In this insulated gate type semiconductor device, if a voltage (gate voltage) higher than a predetermined threshold voltage is applied to the gate electrode, an electric field that is based on the gate voltage causes an electric field effect on the semiconductor substrate, thus allowing current (drain current) to flow. If the application of gate voltage is suspended, the electric field effect disappears, which prohibits drain current from flowing. Thus, if a voltage for causing drain current to flow is applied to the semiconductor substrate, it is possible to control drain current by selectively suspending the application of gate voltage. Since the gate electrode is insulated from the semiconductor substrate with the gate insulation film and the side insulation layer, electric charges that have been injected into the gate electrode do not flow into the semiconductor substrate.

When a gate voltage is applied to the gate electrode, electric charges gather around an end portion of the gate electrode, so that a comparatively strong electric field is generated between the end portion of the gate electrode and the semiconductor substrate. This portion is insulated with the gate insulation film and the side insulation layer. As described above, the side insulation layer of the insulated gate type semiconductor device is formed by turning the substance of the side wall portion of the gate electrode into an insulating substance, so that there is no gap between the side insulation layer and the gate electrode and that there is no conductive dust remaining inside the side insulation layer. That is, those portions exposed to a strong electric field are densely filled with an insulating substance. Hence, dielectric breakdown is unlikely to occur and there is a high voltage resistance obtained between the gate electrode and the semiconductor substrate. Therefore, the insulated gate type semiconductor device of the present invention can also be used in a power system that requires a voltage resistance of more than 30V between the gate electrode and the semiconductor substrate.

The oxide or nitride of the substance of the gate electrode can be used as the side insulation layer, which may also be formed through a wet processing such as an anodic oxidation processing, not to mention an oxidation or nitridation processing in an oxidation diffusion furnace.

A second aspect of the present invention provides an insulated gate type semiconductor device including a gate electrode formed on a semiconductor substrate and an insulation film insulating the gate electrode from the semiconductor substrate, wherein the insulation film is thicker at an end portion of the gate electrode than at a central portion of the gate electrode and wherein a gap between the end portion of the gate electrode and the semiconductor substrate is densely filled with an insulating substance.

The insulated gate type semiconductor device according oto this "second aspect" is identical to that of the first aspect in that drain current is controlled by selectively suspending the application of gate voltage and in that a comparatively strong electric field is generated between the end portion of the gate electrode and the semiconductor substrate when gate voltage is applied to the gate electrode. As described above, this insulated gate type semiconductor device is designed such that the insulation film insulating the gate electrode from the semiconductor substrate is thicker at the end portion of the gate electrode where a strong electric field is generated than at the central portion of the gate electrode and that a gap between the end portion of the gate electrode and the semiconductor substrate is densely filled with an insulating substance. Hence, dielectric breakdown is unlikely to occur and there is a high voltage resistance obtained between the gate electrode and the semiconductor substrate. Therefore, the insulated gate type semiconductor device of the present invention can also be used in a power system that requires a voltage resistance of more than 30V between the gate electrode and the semiconductor substrate. It is to be noted herein that the "insulation film" of this insulated gate type semiconductor device is either a so-called gate insulation film or a side insulation layer as mentioned in the description of the first aspect of the present invention. In other words, it does not matter whether the portion of the insulation film that is located under the end portion of the gate electrode and thicker than the central portion is the gate insulation film or the side insulation layer.

This invention also provides a process for producing the insulated gate type semiconductor device. The process includes the steps of forming a gate insulation film on a semiconductor substrate, forming a gate electrode on the gate insulation film and turning a side wall portion of the gate electrode into an insulating substance.

The gate insulation film is first formed on the semiconductor substrate and then the gate electrode insulated from the semiconductor substrate is formed on the gate insulation film. Then, the side wall portion of the gate electrode is turned into an insulating substance. As is the case with the first aspect of the present invention, the insulated gate type semiconductor device thus produced is designed such that drain current is controlled by selectively suspending the application of gate voltage and that a comparatively strong electric field is generated between the end portion of the gate electrode and the semiconductor substrate when gate voltage is applied to the gate electrode. In this case, the gate electrode is insulated from the semiconductor substrate with the gate insulation film and the insulation layer (side insulation layer) that has been formed in the aforementioned step of turning the substance of the gate electrode into an insulating substance.

As described above, the side wall portion of the gate electrode is turned into an insulating substance in the aforementioned step. Therefore, there is no gap formed between the insulation layer and the gate electrode and there is no conductive dust remaining inside the insulation layer, unlike the case where an insulating substance is deposited (by CVD or the like). That is, those portions where a strong electric field is generated are densely filled with an insulating substance. Hence, dielectric breakdown is unlikely to occur and there is a high voltage resistance obtained between the gate electrode and the semiconductor substrate. In this manner, there is produced an insulated gate type semiconductor device that can also be applied to a power system requiring a voltage resistance of more than 30V between the gate electrode and the semiconductor substrate. The insulation layer that has been formed by turning the substance of the side wall portion of the gate electrode into an insulating substance, which exhibits greater homogeneity than the insulation layer that has been formed by deposition, contributes toward keeping the characteristics of the elements uniformity.

In the aforementioned step of turning the substance of the gate electrode into an insulating substance, it is also advantageous to oxidize the side wall portion of the gate electrode. Oxidation in this step is, for example, a process of thermal oxidation carried out in an oxidation diffusion furnace.

In the aforementioned step of turning the substance of the gate electrode into an insulating substance, it is also advantageous to nitrize the side wall portion of the gate electrode. Nitrization in this step is, for example, a process of thermal nitrization carried out in an oxidation diffusion furnace.

BRIEF DESCRIPTION OF THE DRAWINGS

Further objects, features and advantages of the present invention will become apparent from or are described in the following description of the preferred embodiments with reference to the accompanying drawings, wherein.

DETAILED DESCRIPTION OF PREFERRED EMBODIMENTS

Preferred embodiments of the present invention will hereinafter be described in detail with reference to the accompanying drawings. In these embodiments, the principles of the present invention are used to provide an insulated gate type semiconductor device for use in a power system such as an IGBT or the like. However, the present invention can also be applied to a wide variety of semiconductor devices with insulated gates such as a CMOS or the like.

First Embodiment

Figure 1:
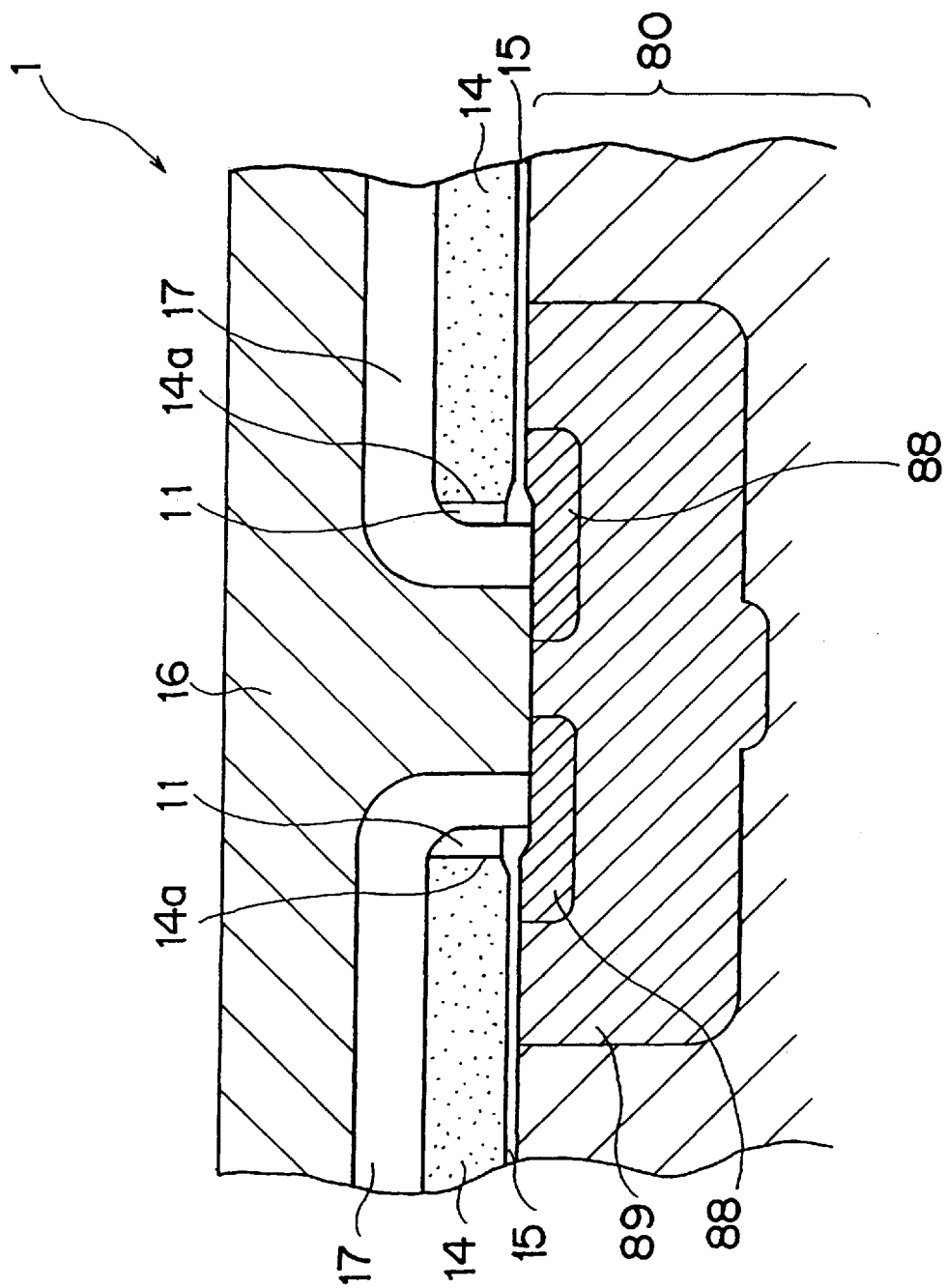
FIG. 1 is a structural view of an insulated gate type semiconductor device according to a first embodiment of the present invention.

FIG. 1 schematically illustrates an insulated gate type semiconductor device 1 according to a first embodiment of the invention. The semiconductor device of the first embodiment includes an n-type epitaxial semiconductor substrate 80, made of silicon on which a gate electrode 14 made of polycrystalline silicon and a source electrode 16 made of a metal such as aluminum or the like are disposed. Although the source electrode 16 is in contact with the semiconductor substrate 80, the gate electrode 14 is insulated from the semiconductor substrate 80 (and the source electrode 16).

To insulate the gate electrode 14 from other portions (the semiconductor substrate 80 and the source electrode 16), the gate electrode 14 is surrounded by a variety of insulating layers. That is, a gate insulation film 15 is disposed between the gate electrode 14 and the semiconductor substrate 80 so as to insulate these components from each other. The gate insulation film 15 is formed by thermal oxidation of the semiconductor substrate 80. Although the gate insulation film 15 may range in thickness approximately from 50 nm to 100 nm, it has a thickness of 75 nm in the present embodiment. A top face and side faces of the gate electrode 14 are covered with an interlayer insulation film 17, which insulates the gate electrode 14 from the source electrode 16. The interlayer insulation film 17 is formed by depositing an oxide by CVD after the gate electrode 14 has been formed or processed. A side insulation layer 11 is in contact with a side wall 14a of the gate electrode 14. The side insulation layer 11, which is formed by oxidizing the substance of the gate electrode 14 (i.e. polycrystalline silicon), reinforces the insulation between the semiconductor substrate 80 and the gate electrode 14, especially a portion in the vicinity of the side wall 14a.

The semiconductor substrate 80 is provided with a known well structure composed of a source diffusion portion 88, a channel region 89 and the like. The well structure is capable of controlling a current flowing in a direction of thickness of the semiconductor substrate 80 by adjusting a voltage applied to the gate electrode 14 (gate voltage). Source electrode 16 is in contact with the source diffusion portion 88 of the semiconductor substrate 80. As is apparent from FIG. 1, the first embodiment employs a layout having two elements symmetrically arranged.

Figure 2:
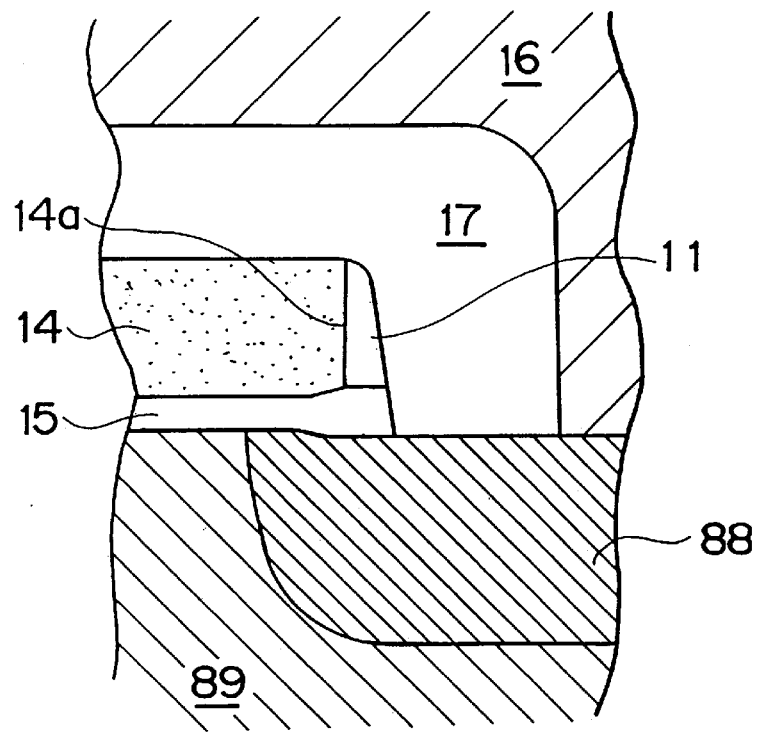
FIG. 2 is an enlarged view of the essential part of the semiconductor device a shown in FIG. 1.

As can be seen from an enlarged view in FIG. 2, the gate insulation film 15 is thicker around the side wall 14a of the gate electrode 14 than around the center thereof. Even in the vicinity of the side wall 14a, the gap formed between the gate electrode 14 and the semiconductor substrate 80 is densely filled with an insulation substance (silicon oxide).

The operation of the insulated gate type semiconductor device of the aforementioned structure will now be described. The insulated gate type semiconductor device is used by first applying a voltage (drain voltage) in the direction of thickness of the semiconductor substrate 80 and then adjusting a gate voltage. If no voltage is applied to the gate electrode 14, that is, if the gate voltage is null, a depletion layer for preventing the flow of a current (drain current) resulting from the drain voltage exists inside the semiconductor substrate 80, due to the well structure composed of the source diffusion portion 88, the channel region 89 and the like. Thus, drain current cannot flow. By applying a gate voltage (assuming a positive value with respect to the semiconductor substrate 80), an n-channel is formed in the surface of the channel region 89 due to an electric field effect. Thus, when the gate voltage reaches a predetermined value, the n-channel operates to conduct electricity from the front face to the back face of the semiconductor substrate 80, whereby the drain current flows. For use in a power system as in the present embodiment, the gate voltage to be applied does not drop below 10V. If the application of gate voltage is suspended, the drain current also stops flowing. In this manner, it is possible to control drain current by adjusting gate voltage.

When gate voltage is applied, a strong electric field exists between the gate electrode 14 and the semiconductor substrate 80. In particular, the electric field is comparatively strong in the vicinity of the side wall 14a of the gate electrode 14. This is because electric charges gather around the side wall 14a.

However, the insulated gate type semiconductor device of the first embodiment is designed such that the gate electrode 14 is insulated around the side wall 14a not only with the gate insulation film 15 but also with the side insulation layer 11. The side insulation layer 11 serving to reinforce such insulation is formed by oxidizing the substance of the gate electrode 14. The gate insulation film 15 is thicker around the side wall 14a of the gate electrode 14 than around the center thereof. In the vicinity of the side wall 14a, the gate electrode 14 is at a slightly greater distance from the semiconductor substrate 80, which also serves to weaken the electric field generated around the side wall 14a. Thus, even if a strong electric field is generated, there is no possibility of dielectric breakdown occurring. The semiconductor device exhibits a high voltage resistance and therefore is highly reliable for use in a power system to which a high gate voltage is applied.

Figure 3:
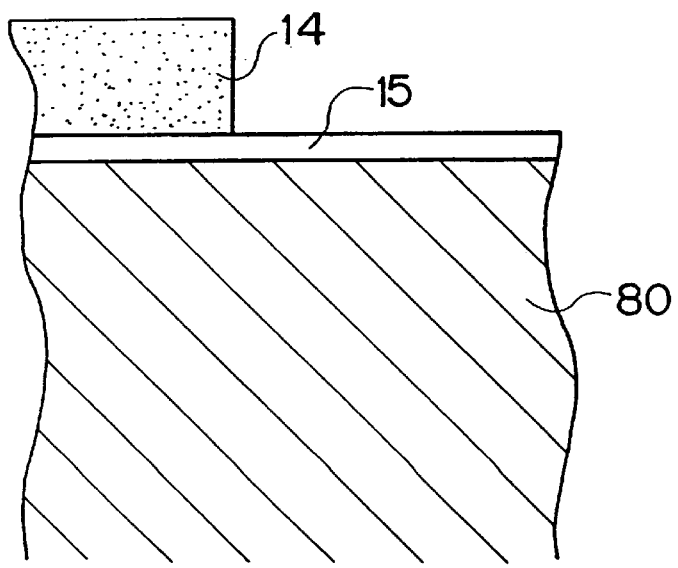
FIGS. 3 through 6 are explanatory views of a process for producing the semiconductor device as shown in FIG. 1.

A process for producing the insulated gate type semiconductor device 1 of the first embodiment will now be described. First, the n-type epitaxial semiconductor substrate 80 is prepared, whose surface is subjected to thermal oxidation and then coated with polycrystalline silicon by CVD. In this manner, the gate insulation film 15 and the polycrystalline silicon film are formed on the semiconductor substrate 80. The gate insulation film 15 ranges in thickness from 50 nm to 100 nm (75 nm in the present embodiment) and the polycrystalline silicon film ranges in thickness from 400 nm to 500 nm (450 nm in the present embodiment). As illustrated in FIG. 3, the polycrystalline silicon film is then subjected to a pattern processing by means of photolithography and etching so as to form the gate electrode 14 of a predetermined pattern, and the gate insulation film 15 is not etched. In this state, the channel region 89 is formed by means of ion implantation, as can be seen from FIG. 4.

Figure 4:
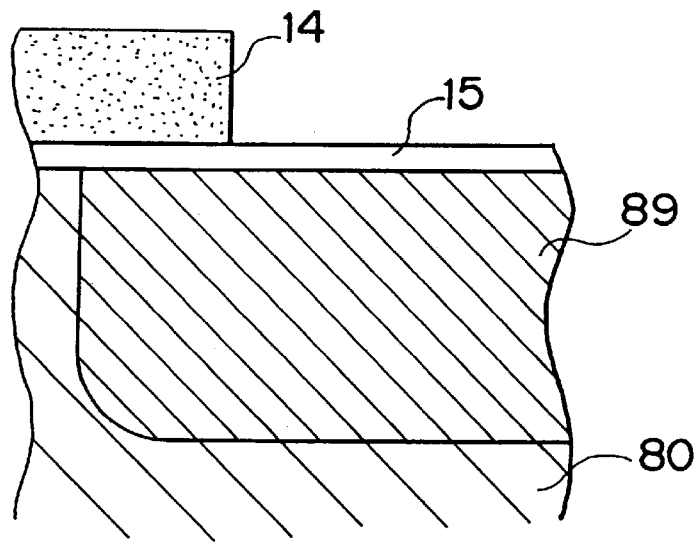
Figure 5:
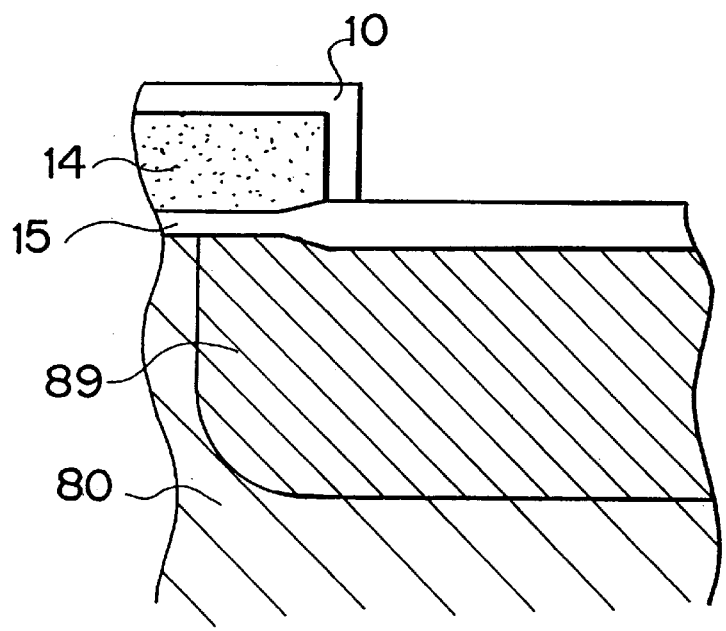

By subjecting the semiconductor substrate 80 to thermal oxidation in an oxidation diffusion furnace (e.g. maintaining the semiconductor substrate 80 at a high temperature in the mixed atmosphere of $O_2$ and $H_2$), the top face and the side wall of the gate electrode 14 become oxidized, thus forming a silicon oxide layer covering the gate electrode 14. The silicon oxide layer to be formed ranges in thickness from 50 nm to 200 nm. The silicon oxide layer of the present embodiment, which has a thickness of 150 nm, has been obtained by performing thermal oxidation at 950° C. for 23 minutes. During such thermal oxidation, it is not only the top face and the side wall of the gate electrode 14 that are oxidized. Oxidation slightly progresses also in a bottom face end portion of the gate electrode 14 or in a surface portion of the semiconductor substrate 80 that is covered with the gate insulation film 15 but not with the gate electrode 14. Thus, as illustrated in FIG. 5, the portion of the gate insulation film 15 that is not covered with the gate electrode 14 is increased in thickness, whereby the semiconductor substrate 80 is at a greater distance from the end portion of the gate electrode 14 than from the center portion thereof. The gap between the end portion of the gate electrode 14 and the semiconductor substrate 80 is densely filled with silicon oxide. Due to oxidization, the gate electrode 14 as shown in FIG. 5 is slightly smaller in width and thickness than the gate electrode 14 as shown in FIG. 4. However, if the size of the silicon oxide layer 10 formed on the gate electrode 14 is taken into account, the gate electrode 14 is slightly larger in width and thickness than the gate electrode as shown in FIG. 4.

Figure 6:
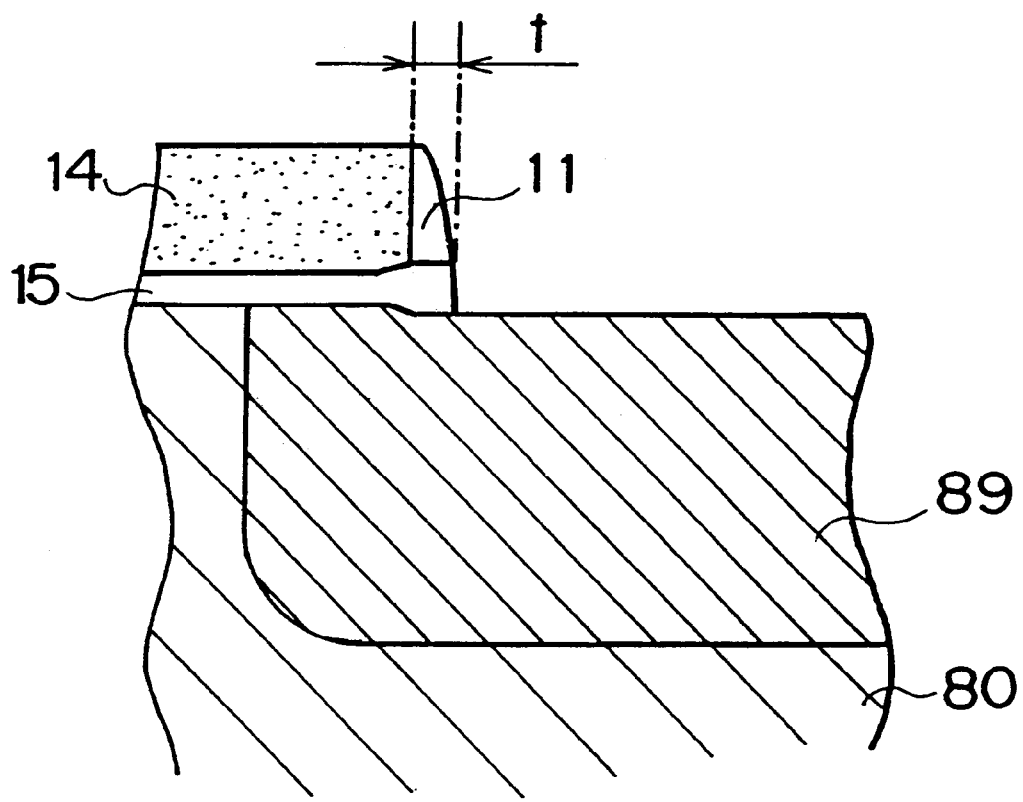

In this state, the surface of the semiconductor substrate 80 is subjected to reactive ion etching, which is a kind of dry etching. Reactive ion etching is carried out under the conditions where silicon oxide is reactive to etching but silicon crystal is not reactive to etching and where the process of etching progresses almost in the depth direction with a high degree of anisotropy. Therefore, the reactive ion etching is carried out under a relatively low gas pressure (e.g. about 3 Pa) and with relatively high RF power (e.g. about 400 W), using $CHF_3$ and $CF_4$ as etching gas and $O_2$ as supplementary gas. This etching process is carried out until the silicon oxide layer 10 formed on the gate electrode 14 and the gate insulation film 15 that is not covered with the gate electrode 14 disappear, so that a silicon oxide layer is left beside the gate electrode 14. Consequently, the side insulation layer 11 is formed on the side wall 14a of the gate electrode 14, as can be seen from FIG. 6. The side insulation layer 11 as shown in FIG. 6 has a width t of about 100 nm at the bottom thereof.

The source diffusion portion 88 is then formed by means of ion implantation and the interlayer insulation film 17 and the source electrode 16 are subsequently formed, whereby the state as shown in FIG. 1 is realized. By additionally forming necessary electrodes, wires and the like and sealing these components, the insulated gate type semiconductor device is obtained.

As described hitherto in detail, the insulated gate type semiconductor device 1 and the process for producing the device according to the first embodiment are designed such that the gate electrode 14 is oxidized after being processed and that a portion of the silicon oxide layer thus obtained serves as the side insulation layer 11, which together with the gate insulation film 15 insulates the gate electrode 14 from the semiconductor substrate 80. In this manner, the gate electrode 14 is insulated from the semiconductor substrate 80 by the side insulation layer 11 which has been formed by oxidizing the substance of the gate electrode 14. Thus, the gate electrode 14 is in close contact with the side insulation layer 11 unlike the case with an insulation layer deposited by CVD or the like. Even if conductive dust has clung to a portion of the gate electrode 14 to be oxidized, the dust is removed by oxidation. Therefore, the insulated gate type semiconductor device of the present embodiment is resistant to dielectric breakdown and high in voltage resistance to such an extent that it can also be applied to a power system to which a gate voltage of about 10V is applied.

Figure 11:
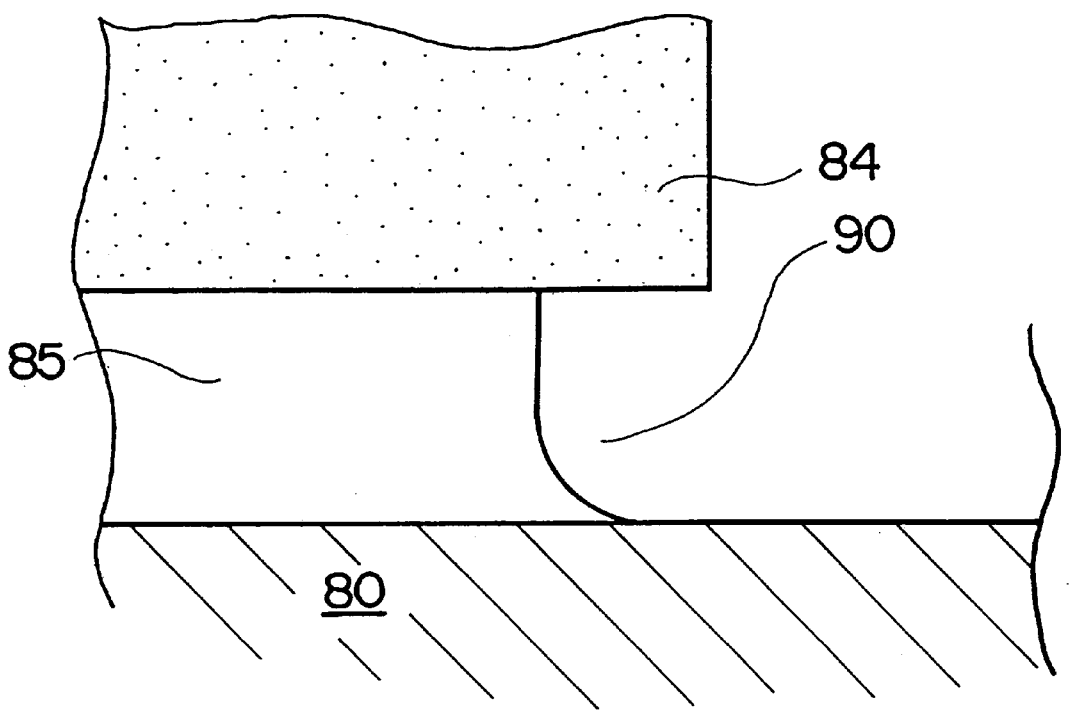
FIG. 11 is an enlarged view of the essential part of the semiconductor vice as shown in FIG. 10.

Because of the process of oxidizing the gate electrode 14, the gate insulation film 15 is thicker around the side wall 14a than around the center of the gate electrode 14. Thus, the distance between the gate electrode 14 and the semiconductor substrate 80 is great in the vicinity of the side wall 14a, whereby the strong electric field generated between the side wall 14a and the semiconductor substrate 80 in applying gate voltage is weakened. This also prevents the occurrence of dielectric breakdown between the gate electrode 14 and the semiconductor substrate 80 and enhances voltage resistance. Since a portion of the gate insulation film 15 located under the side wall 14a of the gate electrode 14 is not subjected to etching, the undercut as mentioned in the description of the related art with reference to FIG. 11 is not generated in that portion. Thus, that portion is free from a void or conductive dust which causes dielectric breakdown. Also from this point of view, the voltage resistance is enhanced between the gate electrode 14 and the semiconductor substrate 80.

In this embodiment, the width t of the side insulation layer 11 at the bottom thereof depends on the thickness of the silicon oxide layer 10 after thermal oxidation of the gate electrode 14 and the etching conditions of the etching process that is subsequently performed. In comparison with CVD, the width t exhibits good homogeneity among or inside wafers. Besides, the width t is stable due to a self-alignment without photolithography. Accordingly, the respective elements exhibit uniformity characteristics. In particular, there is no difference in characteristics between left and right sides of FIG. 1 generated due to the lack of precision in combining photomasks. Therefore, it is possible to produce the insulated gate type semiconductor device with high yields. In addition, since the process of photolithography is not employed to form the side insulation layer 11, the number of processes required is quite small, which prevents an increase in costs or the time required to produce the semiconductor device.

The present embodiment is designed such that after the polycrystalline silicon film has been subjected to a patterning process to form the gate electrode 14, the channel region 89 is formed and the gate electrode 14 is oxidized without subjecting the gate insulation film 15 to etching. However, the channel region 89 and the like maybe formed after subjecting the gate insulation film 15 to etching. Especially in the case where the channel region 89 is formed by being implanted with an ion of an atom of a relatively large diameter such as gallium, it is desirable to form the channel region 89 after removing the gate insulation film 15. This is because such an ion does not sufficiently permeate into the insulation film.

In this case, the semiconductor substrate 80 as shown in FIG. 3 is subjected to wet chemical etching and the channel region 89 is formed by means of ion implantation after removing the portion of the gate insulation film 15 that is not covered with the gate electrode 14. By subsequently forming the side insulation layer 11, the insulated gate type semiconductor device 1 as shown in FIG. 1 is obtained.

Figure 12:
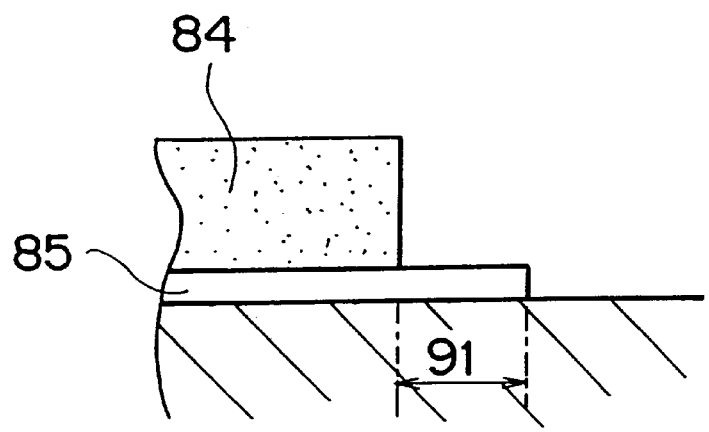
FIG. 12 illustrates part of a process for producing the insulated gate type semiconductor device according to the related art.

In carrying out wet chemical etching in this case, it is not necessary to leave a certain width of the gate insulation film 15 protruding from the end portion of the gate electrode 14 as is the case with the related art (See FIG. 12). Even if an undercut is formed under the end portion of the gate electrode 14 due to wet chemical etching, a portion of the gate electrode 14 around the undercut is sufficiently oxidized at the time of thermal oxidation for forming the side insulation layer 11, whereby the under cut is densely filled with silicon oxide. Thus, there is no need to excessively increase the number of photolithography processes and the characteristics of the elements remain uniformity. Even if a small amount of treating liquid for wet chemical etching remains in the aforementioned portion of the gate electrode 14, it is removed by being sublimed or incinerated at the time of thermal oxidation of the gate electrode 14.

Therefore, it is possible to produce an insulated gate type semiconductor device that is high in voltage resistance and suited for use in a power system, with high yields and in a relatively small number of processes.

Second Embodiment

Figure 7:
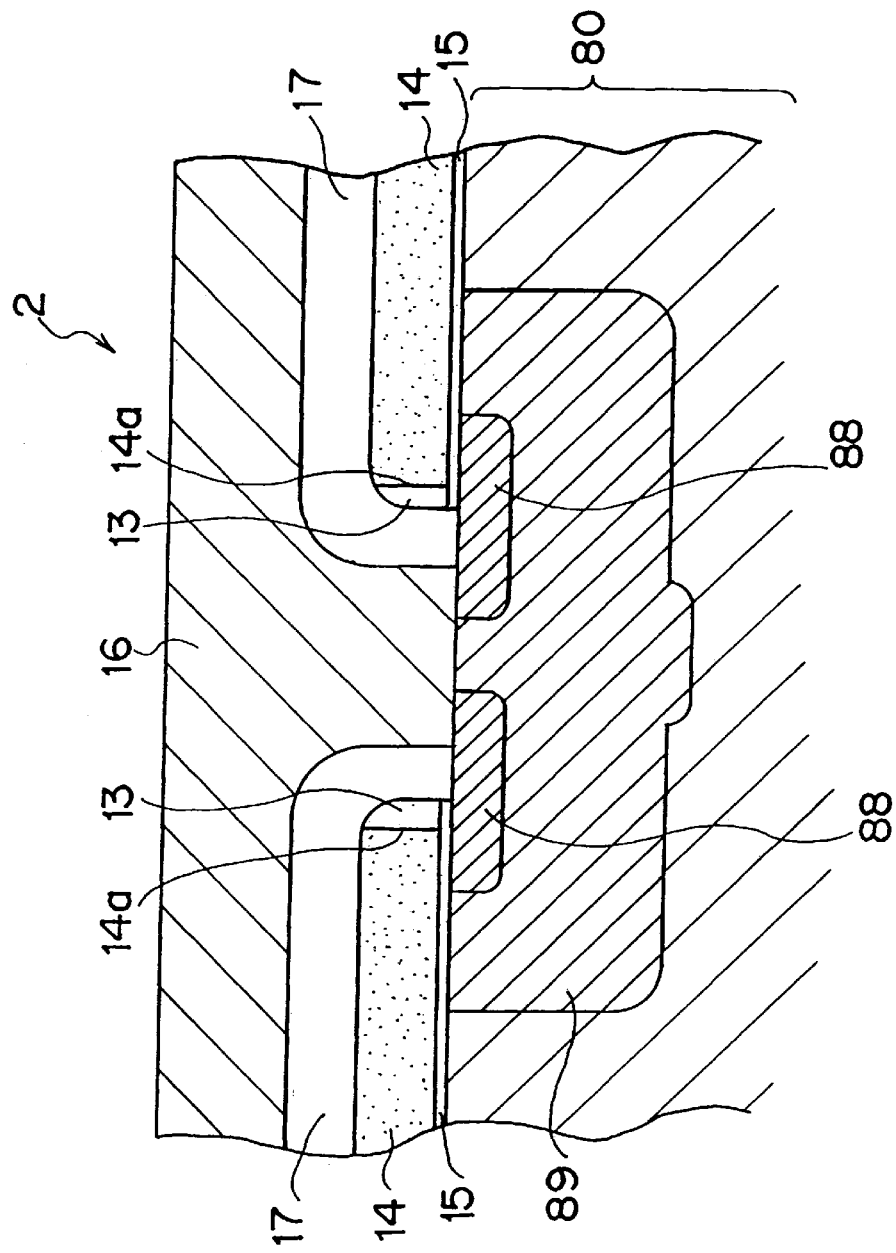
FIG. 7 is a structural view of an insulated gate type semiconductor device according to a second embodiment of the present invention.

FIG. 7 schematically illustrates the structure of an insulated gate type semiconductor device 2 according to a second embodiment. The insulated gate type semiconductor device of the present embodiment is substantially the same as that of the first embodiment. Thus, the following description will be centered on the aspects that are different from those of the first embodiment. According to a first aspect of the second embodiment, the side insulation layer 13 formed on the side wall 14a consists of silicon nitride instead of silicon oxide. However, as is the case with the side insulation layer 11 of the first embodiment, the side insulation layer 13 consisting of silicon nitride is also obtained from the substance of the gate electrode 14 instead of being deposited by CVD or the like. In other words, the side insulation layer 13 is formed by nitrizing the substance of the gate electrode 14. According to the second aspect of the second embodiment, the gate insulation film 15 is not particularly thicker around the side wall 14a of the gate electrode 14 than around the center thereof. Except for these two aspects, the insulated gate type semiconductor device of the second embodiment is substantially identical to that of the first embodiment.

Thus, the basic performance of the insulated gate type semiconductor device of the second embodiment is substantially the same as that of the first embodiment. As is the case with the first embodiment, the electric field generated between the gate electrode 14 and the semiconductor device 80 is particularly strong around the side wall 14a at the end of the gate electrode 14. Concretely, the electric field around the side wall 14a is almost as strong as $2 \times 10^8$ V/m.

However, the insulated gate type semiconductor device of the second embodiment is designed such that the portion in the vicinity of the side wall 14a is insulated not only with the gate insulation film 15 but also with the side insulation layer 13 formed by nitrizing the substance of the gate electrode 14. As a result, even if a strong electric field as described above is generated, there is no possibility of dielectric breakdown occurring. Thus, the insulated gate type semiconductor device of the second embodiment exhibits high voltage resistance and therefore can be used with high reliability in a power system to which a high gate voltage is applied.

A process of producing the insulated gate type semiconductor device of the second embodiment will now be described. First, the n-type epitaxial semiconductor substrate 80 is prepared, whose surface is subjected to thermal oxidation and then coated with polycrystalline silicon by CVD. In this manner, the gate insulation film 15 and the polycrystalline silicon film are formed on the semiconductor substrate 80. The polycrystalline silicon film is then subjected to a pattern processing by means of photolithography and etching so as to form the gate electrode 14 of a predetermined pattern, and the gate insulation film 15 is not etched. In this state, the channel region 89 is formed by means of ion implantation. These respective steps are the same as those of the first embodiment. That is, the state where the gate electrode 14 has been processed is identical to that as shown in FIG. 3 and the state where the channel region 89 has been formed is identical to that as shown in FIG. 4.

Figure 8:
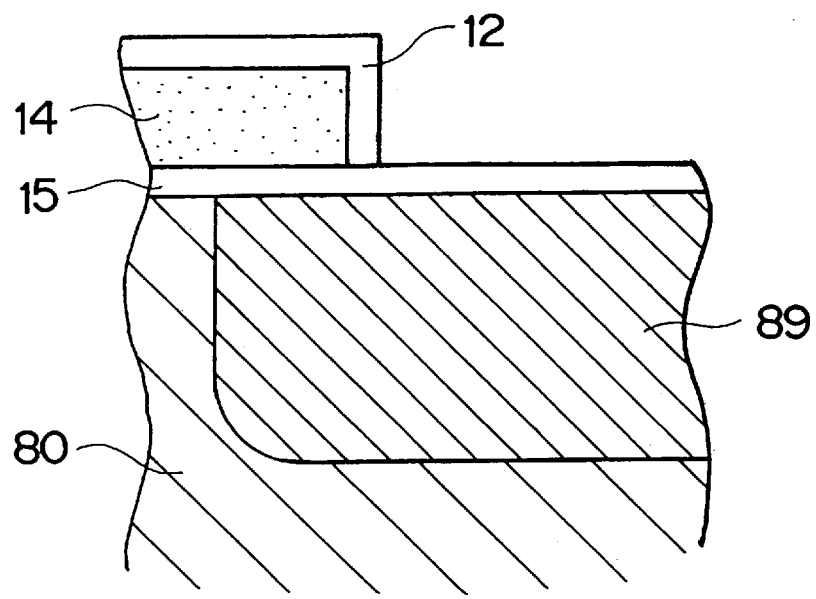
FIGS. 8 and 9 are explanatory views of a process for producing the semiconductor device as shown in FIG. 7.

The gate electrode 14 is then subjected to a process of nitrization. For this purpose, the top face and the side walls of the gate electrode 14 are first implanted with nitrogen ion. The amount of ion implantation approximately ranges from $1 \times 10^{17}$/cm$^2$ to $1 \times 10^{19}$/cm$^2$ (in the present embodiment, $1 \times 10^{18}$/cm$^2$). In this case, the semiconductor substrate is tilted and rotated during ion implantation so that the side wall of the gate electrode 14 is also sufficiently implanted with nitrogen ion. By annealing the gate electrode 14 in the atmosphere of nitrogen using an oxidation diffusion furnace, a silicon nitride layer is formed on the top face and the side walls of the gate electrode 14. That is, the gate electrode 14 is covered with the silicon nitride layer, as can be seen from FIG. 8. The silicon nitride layer to be formed ranges in thickness from 50 nm to 150 nm. In the present embodiment, a nitride layer 12 having a thickness of 100 nm is obtained by annealing the gate electrode 14 at 1100° C. for two hours. Due to nitrization, the gate electrode 14 as shown in FIG. 8 is slightly smaller in width and thickness than that as shown in FIG. 4. However, if the size of the silicon nitride layer 12 formed on the gate electrode 14 is taken into account, the gate electrode 14 is slightly larger in width and thickness than the gate electrode as shown in FIG. 4.

Figure 9:
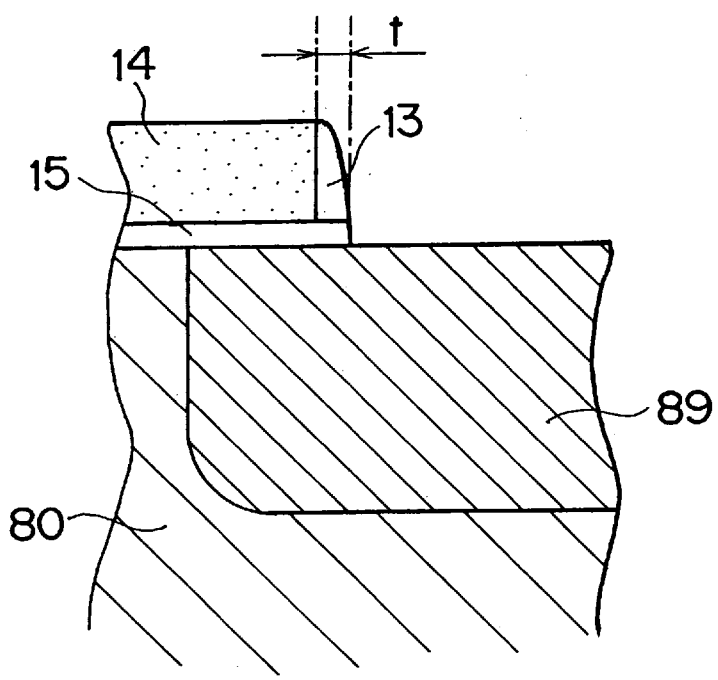
Figure 10:
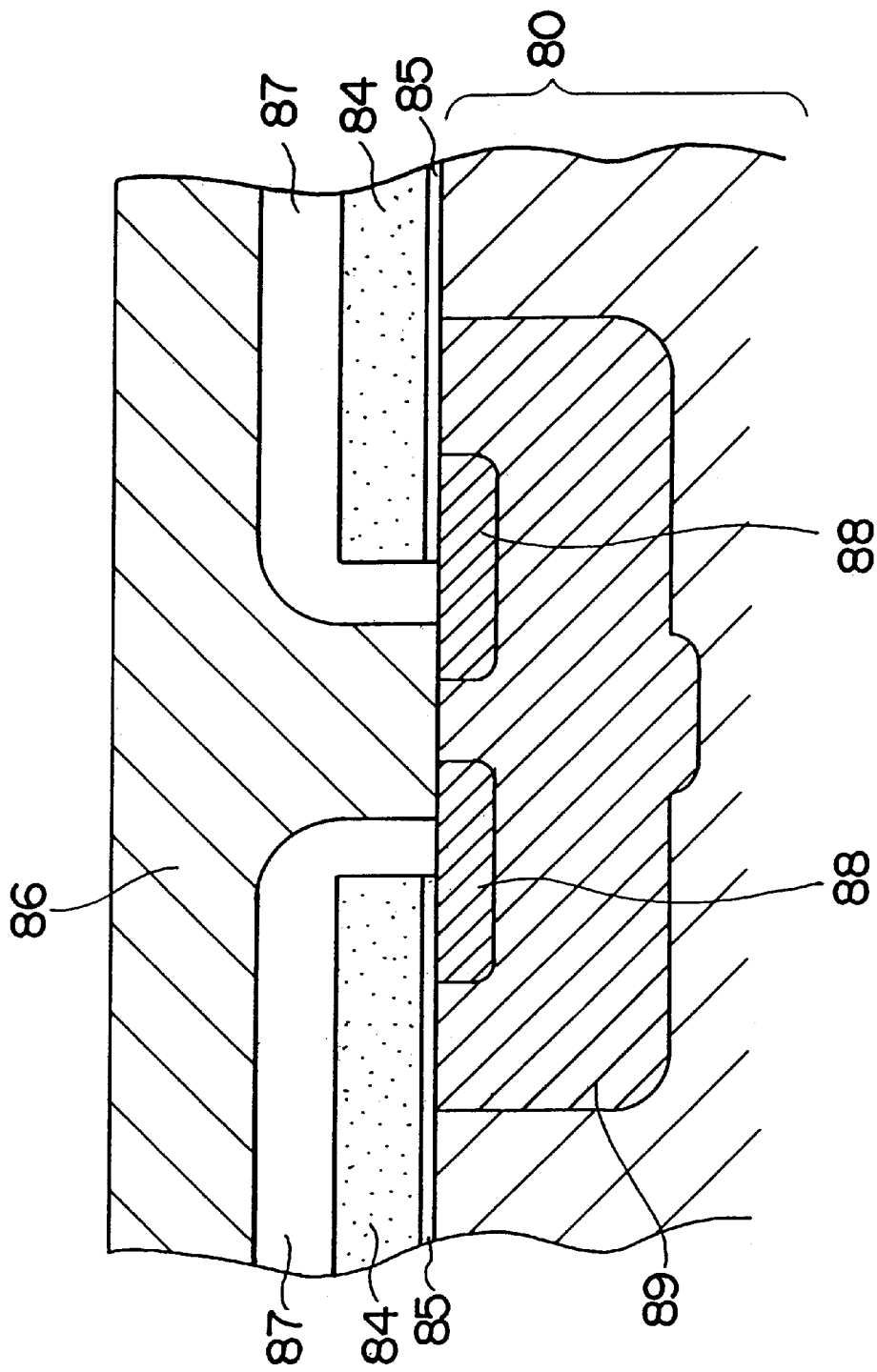
FIG. 10 is a structural view of a generally employed insulated gate type semiconductor device according to the related art.

In this state, the surface of the semiconductor substrate 80 is subjected to reactive ion etching, which is a kind of dry etching. The reactive ion etching is carried out under the conditions where silicon nitride is reactive to etching but silicon is not reactive to etching and where the process of etching progresses almost in the depth direction with a high degree of anisotropy. Therefore, the reactive ion etching is carried out under a relatively low gas pressure (e.g. about 3 Pa) and with relatively high RF power (e.g. about 400 W), using $CHF_3$ and $CF_4$ as etching gas and $O_2$ as supplementary gas. This etching process is carried out until the silicon nitride layer 12 formed on the gate electrode 14 and the gate insulation film 15 that is not covered with the gate electrode 14 disappear, whereby a silicon nitride layer is left beside the gate electrode 14. Consequently, the side insulation layer 13 is formed on the side wall 14a of the gate electrode 14, as can be seen from FIG. 9. The side insulation layer 13 as shown in FIG. 9 has a width t of about 100 nm at the bottom thereof.

The source diffusion portion 88 is then formed by means of ion implantation and the interlayer insulation film 17 and the source electrode 16 are subsequently formed, whereby the state as shown in FIG. 7 is realized. By additionally forming necessary electrodes, wires and the like and sealing these components, the insulated gate type semiconductor device of the second embodiment is obtained.

As described hitherto in detail, the insulated gate type semiconductor device 2 and the process for producing the device according to the second embodiment are designed such that the gate electrode 14 is nitrized after being processed and that a portion of the silicon nitride layer thus obtained serves as the side insulation layer 13, which together with the gate insulation film 15 insulates the gate electrode 14 from the semiconductor substrate 80. In this manner, the gate electrode 14 is insulated from the semiconductor substrate 80 with the side insulation layer 11 which has been formed by nitrizing the substance of the gate electrode 14. Thus, the gate electrode 14 is in close contact with the side insulation layer 13 unlike the case with an insulation layer deposited by CVD or the like. Even if conductive dust has clung to a portion of the gate electrode 14 to be nitrized, the dust is removed by nitrization. Therefore, the insulated gate type semiconductor device of the present embodiment is resistant to dielectric breakdown and high in voltage resistance.

Since a portion of the gate insulation film 15 located under the side wall 14a of the gate electrode 14 is not subjected to etching, the undercut as mentioned in the description of the related art with reference to FIG. 11 is not generated in that portion. Thus, that portion is free from a void or conductive dust that causes dielectric breakdown. Also from this point of view, the voltage resistance is enhanced between the gate electrode 14 and the semiconductor substrate 80.

Further in the present embodiment, the width t of the side insulation layer 13 at the bottom thereof depends on the thickness of the silicon nitride layer 12 after nitrization of the gate electrode 14 and the etching conditions of the etching process that is subsequently carried out. In comparison with CVD, the width t exhibits good homogeneity among or inside wafers. Besides, the width t is stable due to a self-alignment without photolithography. Accordingly, the respective elements exhibit uniformity characteristics. In particular, there is no difference in characteristics between left and right sides of FIG. 7 generated due to the lack of precision in combining photomasks. Therefore, it is possible to produce the insulated gate type semiconductor device with high yields. In addition, since the process of photolithography is not employed to form the side insulation layer 13, the number of processes required is quite small, which prevents an increase in costs or the time required to produce the semiconductor device.

As is the case of the first embodiment, the second embodiment may also be modified such that the channel region 89 and the like are formed after performing a pattern processing of the gate electrode 14 and subjecting the gate insulation film 15 to etching.

Although the second embodiment employs a nitride of the substance of the gate electrode 14 as the side insulation layer 13 formed on the side wall 14a of the gate electrode 14, various insulating compounds based on the substance of the gate electrode 14 can be used. For example, it is possible to utilize a silicon compound obtained by subjecting the substance of the gate electrode 14 to an anodic oxidation processing or to utilize another silicon compound obtained by inducing a reaction of oxidizing chemicals such as sulfuric acid, perchloric acid and the like. In the case where any of these compounds is utilized, after the channel region 89 has been formed (as shown in FIG. 4), a suitable processing is carried out to form a compound layer that is then subjected to dry etching. Also in the case where these insulating compounds are used, the insulated gate type semiconductor device of equally high voltage resistance can be produced with high yields and in simplified steps.

While the present invention has been described with reference to what are presently considered to be preferred embodiments thereof, it is to be understood that the invention is not limited to the disclosed embodiments or constructions. On the contrary, the invention is intended to cover various modifications and equivalent arrangements. In addition, while the various elements of the disclosed invention are shown in various combinations and configurations, which are exemplary, other combinations and configurations, including more, less or only a single embodiment, are also within the spirit and scope of the invention.

For example, although the aforementioned embodiments employ the elements composed of n-type substrates, it is also possible to use p-type substrates. The well structure (the source diffusion portion 88 and the channel region 89) formed inside the semiconductor substrate 80 may take other shapes.

What is claimed is:

1. A process for producing an insulated gate type semiconductor device comprising:
    forming a gate insulation film on a semiconductor substrate;
    forming a gate electrode on said gate insulation film;
    oxidizing top and sidewalls of said gate electrode such that simultaneously a silicon oxide layer is formed covering said gate electrode and said semiconductor substrate is at a greater distance from an end portion of the gate electrode than from a center portion of said gate electrode;
    forming a source diffusion region by ion implantation using said insulated sidewalls of said gate electrode as a mask; and performing an anisotropic etch on said silicon oxide layer such that the gate insulation film not covered by said gate electrode is removed, and wherein said silicon oxide layer on a sidewall portion of said gate electrode is thicker at a bottom portion of said gate electrode than at a top portion of said gate electrode.

2. The process according to claim 1, wherein said oxidizing step of is carried out by thermal oxidation.

3. A process for producing an insulated gate type semiconductor device comprising:

forming a gate insulation film on a semiconductor substrate;

forming a gate electrode on said gate insulation film;

nitrizing top and sidewalls of said gate electrode such that simultaneously a silicon nitride layer is formed covering said gate electrode and said semiconductor substrate is at a greater distance from an end portion of the gate electrode than from a center portion of said gate electrode;

forming a source diffusion region by ion implantation using said insulated sidewalls of said gate electrode as a mask; and performing an anisotropic etch on said silicon nitride layer such that the gate insulation film not covered by said gate electrode is removed, and wherein said silicon nitride layer on a sidewall portion of said gate electrode is thicker at a bottom portion of said gate electrode than at a top portion of said gate electrode.

4. The process according to claim 1, wherein the ion implantation is carried out after said removal of the gate insulation film.

* * * * *